United States Patent
Min et al.

(10) Patent No.: US 12,112,970 B2
(45) Date of Patent: Oct. 8, 2024

(54) SUBSTRATE TRANSFER APPARATUS

(71) Applicant: SAMSUNG ELECTRONICS CO., LTD., Suwon-si (KR)

(72) Inventors: Daeho Min, Seoul (KR); Junhyung Kim, Yongin-si (KR); Minsoo Han, Suwon-si (KR); Mngu Lee, Cheonan-si (KR); Minwoo Rhee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 645 days.

(21) Appl. No.: 17/460,424

(22) Filed: Aug. 30, 2021

(65) Prior Publication Data
US 2022/0172977 A1    Jun. 2, 2022

(30) Foreign Application Priority Data
Nov. 30, 2020    (KR) .................. 10-2020-0163816

(51) Int. Cl.
H01L 21/683    (2006.01)
B25J 15/06    (2006.01)
B65G 47/91    (2006.01)

(52) U.S. Cl.
CPC ...... H01L 21/6838 (2013.01); B25J 15/0683 (2013.01); B65G 47/91 (2013.01); B65G 2249/045 (2013.01)

(58) Field of Classification Search
CPC ............. H01L 21/6838; B65G 47/91; B65G 2249/045; B25J 15/0683; B25J 15/0691
USPC .............................. 294/186, 188, 189, 64.3
See application file for complete search history.

(56) References Cited

U.S. PATENT DOCUMENTS

| | | | | |
|---|---|---|---|---|
| 3,729,206 A * | 4/1973 | Cachon | ........ | B25B 11/005 269/21 |
| 5,192,070 A * | 3/1993 | Nagai | ........ | B25J 15/0616 271/90 |
| 5,609,377 A * | 3/1997 | Tanaka | ........ | B65G 47/918 901/46 |
| 5,636,887 A * | 6/1997 | Petropoulos | ........ | B65G 47/91 285/305 |
| 6,182,957 B1 * | 2/2001 | Becker | ........ | B25B 11/005 269/21 |

(Continued)

FOREIGN PATENT DOCUMENTS

JP    4678788 B2    11/2008
JP    2009123854 A    6/2009
(Continued)

*Primary Examiner* — Paul T Chin
(74) *Attorney, Agent, or Firm* — MORGAN, LEWIS & BOCKIUS LLP

(57) ABSTRACT

A substrate transfer apparatus includes a body portion having a holding region on a surface thereof corresponding to a substrate. The body portion moves so that the surface thereof approaches the substrate up to at least a first distance. A plurality of vacuum holes are distributed in the holding region and form negative pressure to provide suction force to the substrate disposed at the first distance. At least some of the plurality of vacuum holes are disposed at equal intervals at an edge of the holding region and have the same width. A plurality of air holes are distributed in the holding region and form positive pressure to provide a buoyancy force to the substrate close to the holding region at a second distance smaller than the first distance.

20 Claims, 12 Drawing Sheets

(56)  References Cited

U.S. PATENT DOCUMENTS

| | | | |
|---|---|---|---|
| 8,616,598 B2 | 12/2013 | Cadee et al. | |
| 9,266,686 B2 | 2/2016 | Schilp et al. | |
| 9,553,010 B2 | 1/2017 | Naor | |
| 9,653,338 B2 | 5/2017 | Huang | |
| 10,468,290 B2 | 11/2019 | Ellis et al. | |
| 11,222,809 B2 * | 1/2022 | Yudovsky | G03F 7/0002 |
| 2003/0102682 A1 * | 6/2003 | Kurokawa | H01L 21/6838 |
| | | | 294/188 |
| 2006/0138793 A1 * | 6/2006 | Tanae | B65G 47/91 |
| | | | 294/64.3 |
| 2012/0274011 A1 | 11/2012 | Schilp et al. | |
| 2015/0179495 A1 | 6/2015 | Huang | |
| 2015/0239680 A1 * | 8/2015 | Ogle | B28B 11/16 |
| | | | 414/800 |
| 2015/0321321 A1 | 11/2015 | Kim et al. | |
| 2015/0352726 A1 * | 12/2015 | Harter | B25J 15/0691 |
| | | | 294/185 |
| 2019/0019718 A1 * | 1/2019 | Wu | H01L 21/6838 |
| 2020/0114524 A1 | 4/2020 | Depetris et al. | |
| 2022/0102185 A1 * | 3/2022 | Lee | H01L 21/67796 |

FOREIGN PATENT DOCUMENTS

| | | |
|---|---|---|
| JP | 2016063168 A | 4/2016 |
| KR | 1020200051025 A | 5/2012 |
| KR | 1020150129879 A | 11/2015 |
| KR | 1020160102277 A | 8/2016 |
| WO | 20180099615 A1 | 6/2018 |

\* cited by examiner

III - III'

SUBSTRATE TRANSFER APPARATUS

CROSS-REFERENCE TO RELATED APPLICATION(S)

A claim of priority is made to Korean Patent Application No. 10-2020-0163816 filed on Nov. 30, 2020, in the Korean Intellectual Property Office, the disclosure of which is incorporated herein by reference in its entirety.

BACKGROUND

The present disclosure relates to a substrate transfer apparatus.

As the degree of integration of semiconductor devices increases, the demand for implementing direct bonding techniques has increased. In direct bonding, a die on which a wafer is diced is directly bonded to a surface of another wafer. In particular, bonding surfaces of the die and the wafer are respectively plasma-treated and the die is transferred and attached to the wafer. However, a plasma-treated surface of the die may be contaminated during a process in which the die is held for transfer.

SUMMARY

According to an aspect of the present disclosure, a substrate transfer apparatus includes a body portion having a holding region on a surface thereof corresponding to a substrate. The body portion moves so that the surface approaches the substrate up to at least a first distance. A plurality of vacuum holes are distributed in the holding region and form negative pressure to provide suction force to the substrate disposed at the first distance. At least some of the plurality of vacuum holes are disposed at equal intervals at an edge of the holding region and have the same width. A plurality of air holes are distributed in the holding region and form positive pressure to provide a buoyancy force to the substrate close to the holding region at a second distance smaller than the first distance.

According to an aspect of the present disclosure, a substrate transfer apparatus includes a body portion with a holding region on a surface thereof having a size corresponding to a substrate. The holding region includes a first region disposed in a center of the surface and a second region disposed on a circumference of the first region and in contact with each side of the holding region. A plurality of vacuum holes are distributed in the holding region and provide suction force with respect to the substrate. A plurality of air holes are distributed in the holding region, spaced apart from the plurality of vacuum holes, and provide a buoyancy force acting in a direction opposite to the suction force by jetting a gas.

According to an aspect of the present disclosure, a substrate transfer apparatus includes a body portion having a holding region on a surface thereof corresponding to a substrate. The body portion moves so that the surface approaches the substrate up to at least a first distance. A plurality of vacuum holes are distributed in the holding region and form negative pressure to provide suction force to the substrate disposed at the first distance. At least some of the plurality of vacuum holes are disposed at equal intervals at an edge of the holding region and have the same width. A plurality of air holes are distributed in the holding region and form positive pressure to provide a buoyancy force to the substrate close to the holding region at a second distance smaller than the first distance.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
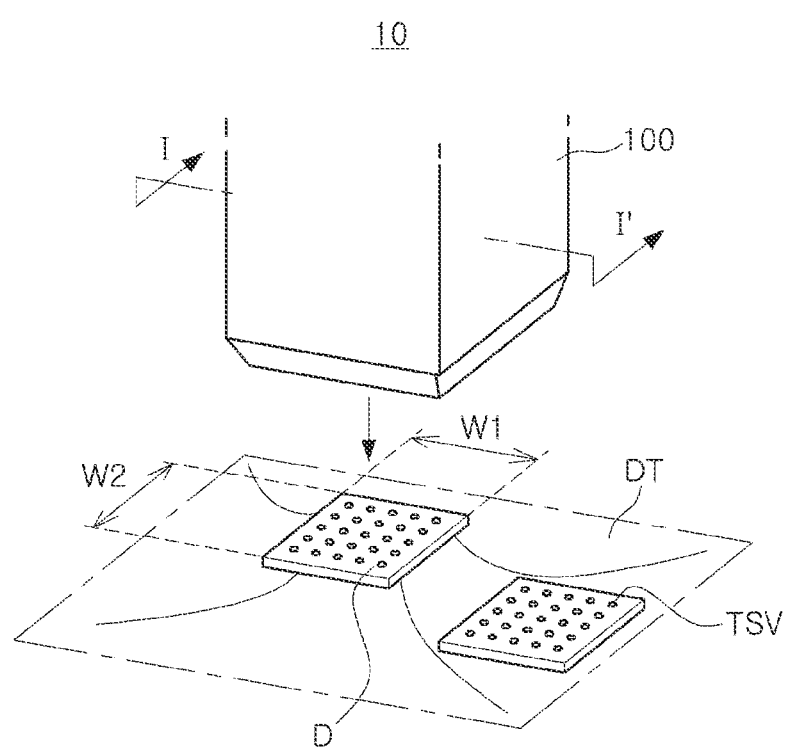
FIG. 1 is a partial perspective view schematically illustrating a substrate transfer apparatus according to an example embodiment of the present disclosure.

A substrate transfer apparatus according to an example embodiment of the present disclosure will be described with reference to FIGS. 1 through 3. FIG. 1 is a partial perspective view schematically illustrating a substrate transfer apparatus according to an example embodiment of the present disclosure, FIG. 2 is a cross-sectional view taken in a vertical plane that includes line I-I' of FIG. 1, and FIG. 3 is a bottom perspective view as seen in direction II of FIG. 2.

Figure 2:
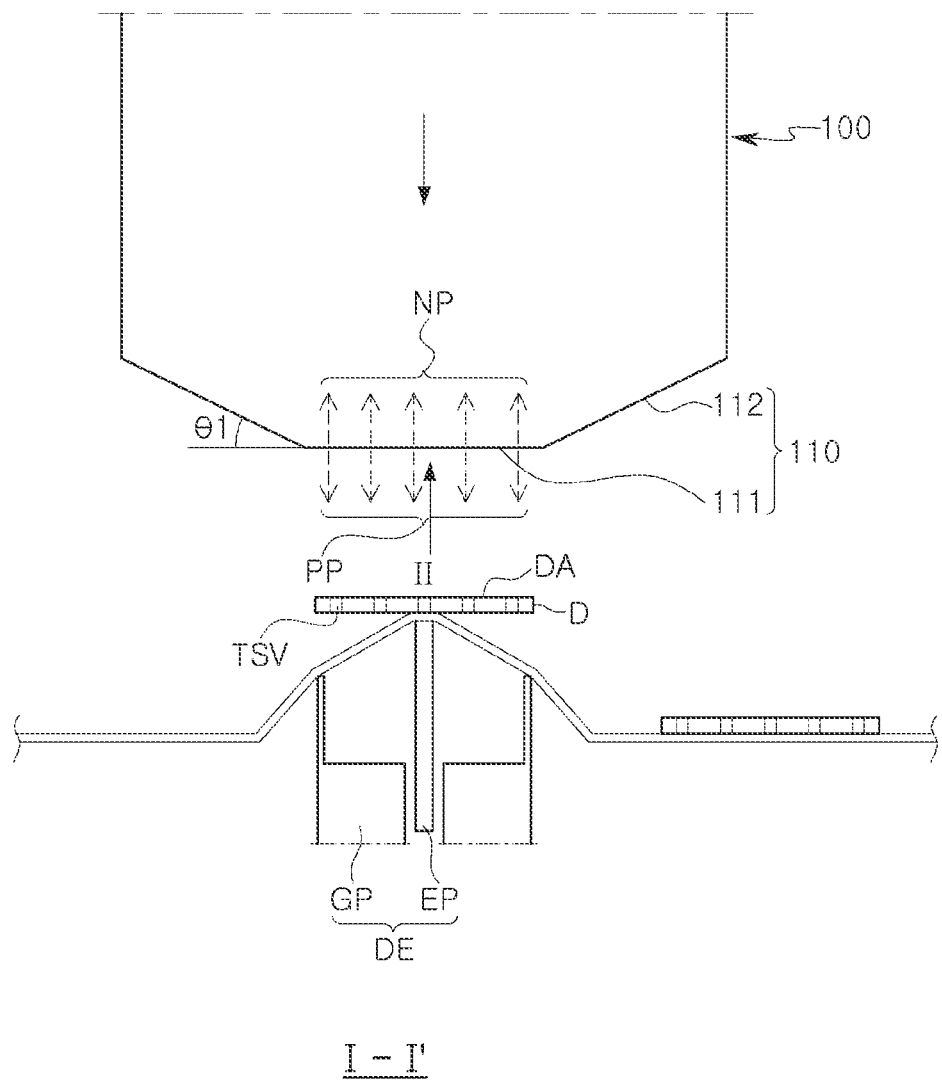
FIG. 2 is a cross-sectional view taken in a vertical plane that includes line I-I' of FIG. 1.
Figure 3:
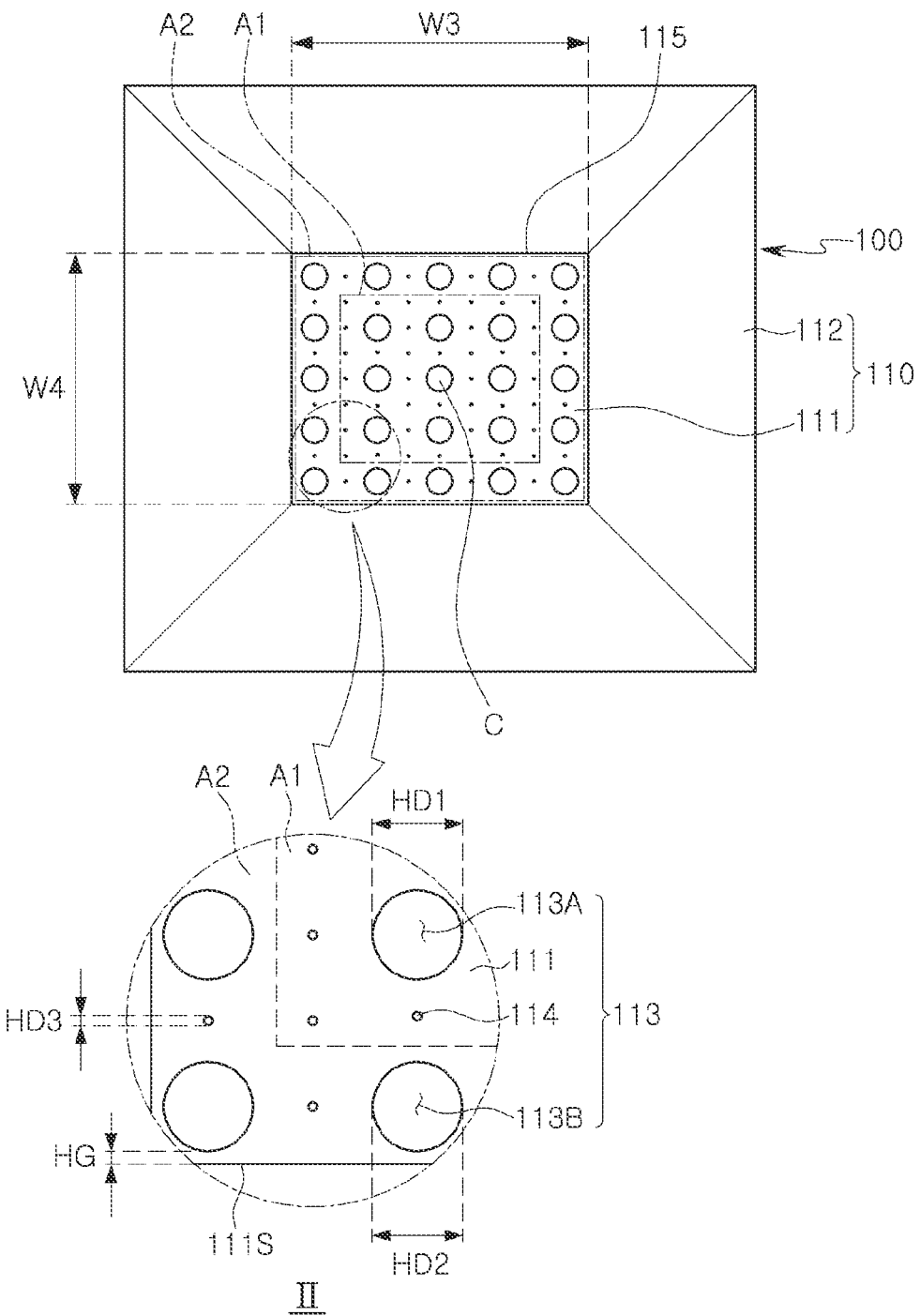
FIG. 3 is a bottom perspective view as seen in direction II of FIG. 2.

Referring to FIGS. 1 and 2, a substrate transfer apparatus 10 according to an example embodiment of the present disclosure may be used to transfer a substrate D after detaching the substrate D from a dicing tape DT. In an example embodiment, the substrate D may be a die in which a through-silicon-via (TSV) is formed. In addition, an upper surface DA of the substrate D may be plasma-treated for a subsequent process. The subsequent process may be a direct bonding process in which the substrate D is directly bonded to a surface of a wafer. In an example embodiment, outer edges of the substrate D form the shape of a rectangle, such as a square, but the present disclosure is not limited thereto. The substrate D may have various other shapes. For example, the substrate D may be circular. As a specific non-limiting example, the substrate D is a square substrate of 10 mm×10 mm.

Referring to FIG. 2, the substrate D attached to an upper surface of the dicing tape DT is lifted by a support GP and eject pin EP of a die ejector DE disposed below a lower surface of the dicing tape DT. As shown, the eject pin EP is raised higher than the support GP, and as such most regions of the lower surface of the substrate D (i.e., regions excluding a central region aligned with the eject pin EP) are separated from the dicing tape DT. The substrate transfer apparatus 10 is configured to completely detach and hold the substrate D mostly separated from the dicing tape DT by the die ejector DE. In the case where the upper surface DA of the substrate D is plasma-treated, the plasma-treated upper surface DA may be contaminated if the substrate transfer apparatus 10 directly contacts the upper surface DA of the substrate D. As such, in the subsequent process of bonding the substrate D to the wafer, a contact force of the substrate D may be weakened and a void may be formed on a contact surface, resulting in a defect. The substrate transfer apparatus 10 according to an example embodiment may perform holding of the substrate D without directly contacting the upper surface DA of the substrate D. In other words, non-contact holding is performed.

The substrate transfer apparatus 10 may have a body portion 100. The body portion 100 may, for example, have a substantially square column shape. On a lower surface 110 of the body portion 100, a region (hereinafter, referred to as a "holding region") to which the substrate D is held and fixed in a non-contact manner may be disposed. The holding region 111 may be disposed at a central region of the lower surface 110 of the body portion 100, and an inclined circumferential region 112 may be disposed around the holding region 111. However, the present disclosure is not limited thereto, and the inclined circumferential region 112 may be omitted or shaped differently according to example embodiments.

Referring to FIG. 2, the holding region 111 may be disposed at a central region of the lower surface 110 of the body portion 100. The holding region 111 may emit a negative pressure (NP) suction force that attracts the substrate D so as to be completely separated from the dicing tape DT and moved towards the holding region 111 of the body portion 100. In addition, the holding region 111 may simultaneously emit a positive pressure (PP) buoyancy force that repels the substrate D away from the holding region 111 of the body portion 100. The suction and buoyancy forces may be balanced such that the substrate D hovers over the holding region 111 without directly contacting the holding region 111.

Referring to FIG. 3, the holding region 111 may be disposed at the central region of the lower surface 110 of the body portion 100. However, as described above, the inclined circumferential region 112 surrounding the holding region 111 may be omitted according to example embodiments, in which case the holding region 111 may constitute an entirety of the lower surface 110. The holding region 111 may have a rectangular shape, but is not limited thereto. The holding region 111 may have a shape corresponding to a shape of the held substrate D. For example, a horizontal width W3 and a vertical width W4 of the holding region 111 may be sizes corresponding to a horizontal width W1 and a vertical width W2 of the substrate D shown in FIG. 1. This is to maximize an effect of automatically aligning the substrate D with the holding region 111, which will be described in detail later. However, the horizontal width W3 and the vertical width W4 of the holding region 111 may not be the completely the same size as the horizontal width W1 and the vertical width W2 of the substrate D and the holding region 111 may be larger or smaller than the substrate D within a predetermined margin. In an example embodiment, this margin may be in the range of ±10% of the horizontal width W1 and the vertical width W2 of the substrate D.

In the holding region 111, a vacuum hole 113 providing the negative pressure NP as a suction force and an air hole 114 providing the positive pressure PP as a buoyancy force may be distributed.

The vacuum hole 113 may include a first vacuum hole 113A disposed at a first region A1, a central region of the holding region 111, and a second vacuum hole 113B disposed at a second region A2 surrounding the first region A1. At least one first vacuum hole 113A and a plurality of second vacuum holes 113B may be arranged adjacent to an edge 111S of the holding region 111.

Figure 4:
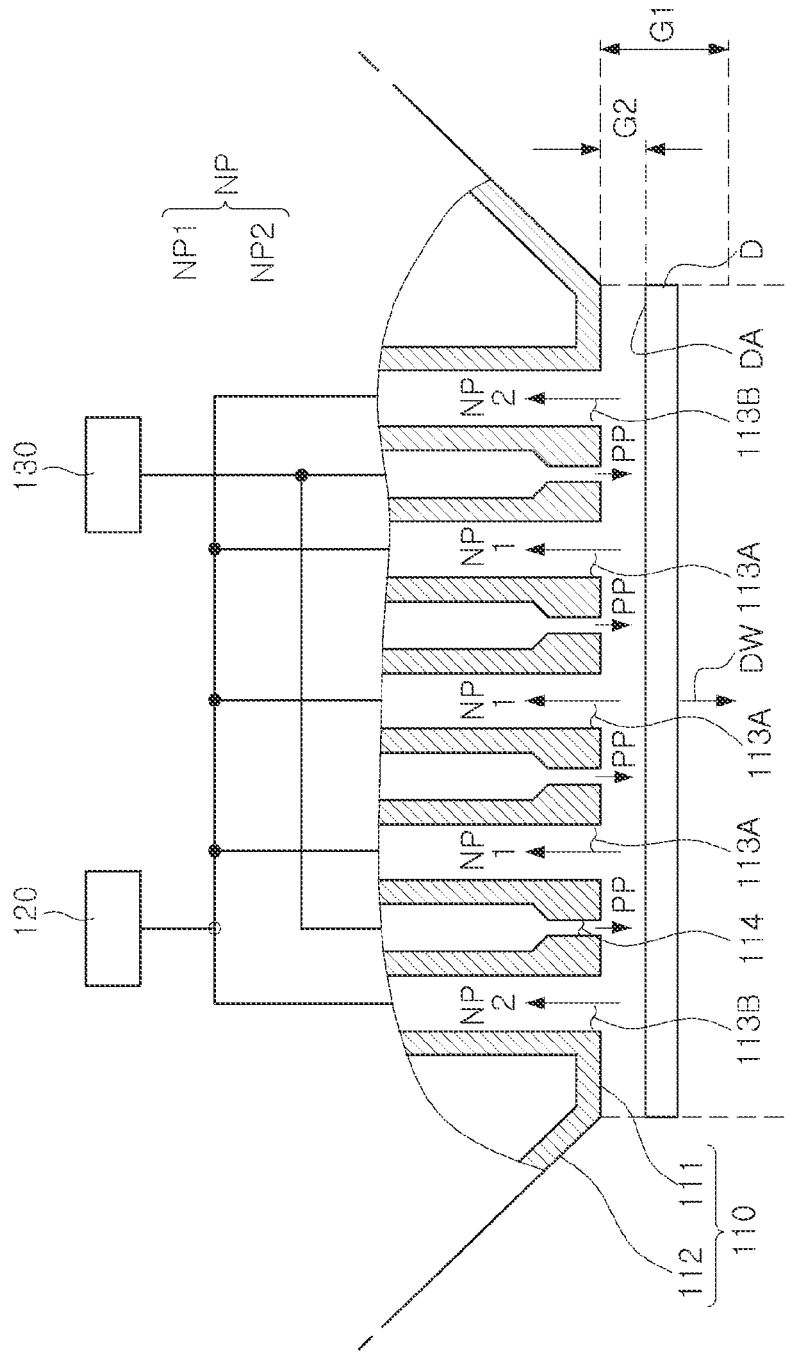
FIG. 4 is a view for reference in describing a state in which a substrate is held by the substrate transfer apparatus of FIG. 2.

Referring to FIG. 4, the first and second vacuum holes 113A and 113B may be connected to a vacuum source 120 and suck ambient air to form a first negative pressure NP1 and a second negative pressure NP2 around the first and second vacuum holes 113A and 113B. The first negative pressure NP1 may have an absolute value greater than that of the second negative pressure NP2. That is, the first vacuum hole 113A may provide a stronger negative pressure than the second vacuum hole 113B.

The first vacuum hole 113A may provide negative pressure sufficient for the substrate D to be separated from the dicing tape DT and lifted toward the holding region 111. That is, the first vacuum hole 113A may provide the first negative pressure NP1, a strong enough negative pressure to allow the substrate D to overcome a load DW and float in the air. An intensity of the first negative pressure NP1 provided from the first vacuum hole 113A may be adjusted so that an effective pressure reaches only a first distance G1 (a predetermined distance) from the holding region 111. Accordingly, only when the body portion 100 is close to the substrate D by a distance equal to or less than the first distance G1, the substrate D may be lifted. In an example embodiment, a magnitude of the first negative pressure NP1 provided from the first vacuum hole 113A may be appropriately adjusted according to a load DW of the substrate D. In an example embodiment, the first distance G1 may be 5 μm to 10 μm and a magnitude of the first negative pressure NP1 may be selected within the range of 10 kPA to 80 kPA depending on the load of the substrate D.

When one first vacuum hole 113A is disposed in the first region A1, the first vacuum hole 113A may be disposed in the center of the first region A1. In addition, referring to FIG. 3, when a plurality of first vacuum holes 113A are arranged in the first region A1, the plurality of first vacuum holes 113A may have a width HD1 of the same size. For example, the first vacuum hole 113A may have a size of 0.9% to 1.1% of each edge 111S of the holding region 111. Specifically, when the holding region 111 has a size of 10 mm×10 mm, the width HD1 of the first vacuum hole 113A may be 0.9 mm to 1.1 mm. In addition, the first vacuum hole 113A may be disposed to be symmetrical with respect to the center C of the holding region 111 so that the applied first negative pressure NP1 is not concentrated on a partial region of the first region A1. In addition, the plurality of first vacuum holes 113A may be distributed and disposed at predetermined intervals in the first region A1 so that negative pressure is uniformly applied to the substrate D.

In the example embodiment, the first vacuum hole 113A has a circular shape. However, the disclosures are not limited thereto, and the first vacuum hole 113A may have other shapes, such as elliptical or polygonal or elongate shapes.

The second vacuum hole 113B may be disposed in the second region A2 surrounding the first region A1 in which the first vacuum hole 113A is disposed. The second vacuum hole 113B may be disposed to be adjacent to each edge 111S of the holding region 111. The second vacuum hole 113B is for automatically aligning the substrate D with the holding region 111. The second vacuum hole 113B may be disposed to contact each edge 111S of the holding region 111, but depending on the example embodiment, the second vacuum hole 113B may be spaced apart from each edge 111S with a predetermined margin HG allowed in the process.

A plurality of second vacuum holes 113B may be arranged. The plurality of second vacuum holes 113B may be arranged at regular intervals in the second region A2. In addition, the plurality of second vacuum holes 113B may have a width HD2 of the same size. However, the present disclosure is not limited thereto and the width HD2 of some of the second vacuum holes 113B among the plurality of second vacuum holes 113B may be selectively larger or smaller according to example embodiments. The second vacuum hole 113B may provide a second negative pressure NP2, which is a weaker negative pressure than the first negative pressure provided by the first vacuum hole 113A. While the first vacuum hole 113A provides a strong first negative pressure NP1 for lifting the substrate D, the second vacuum hole 113B provides the second negative pressure NP2 weaker than the first negative pressure NP1 to serve to guide the substrate D lifted by the first vacuum hole 113A to be disposed at a correct position exactly matched with the holding region 111. This will be described with reference to FIG. 5.

Figure 5:
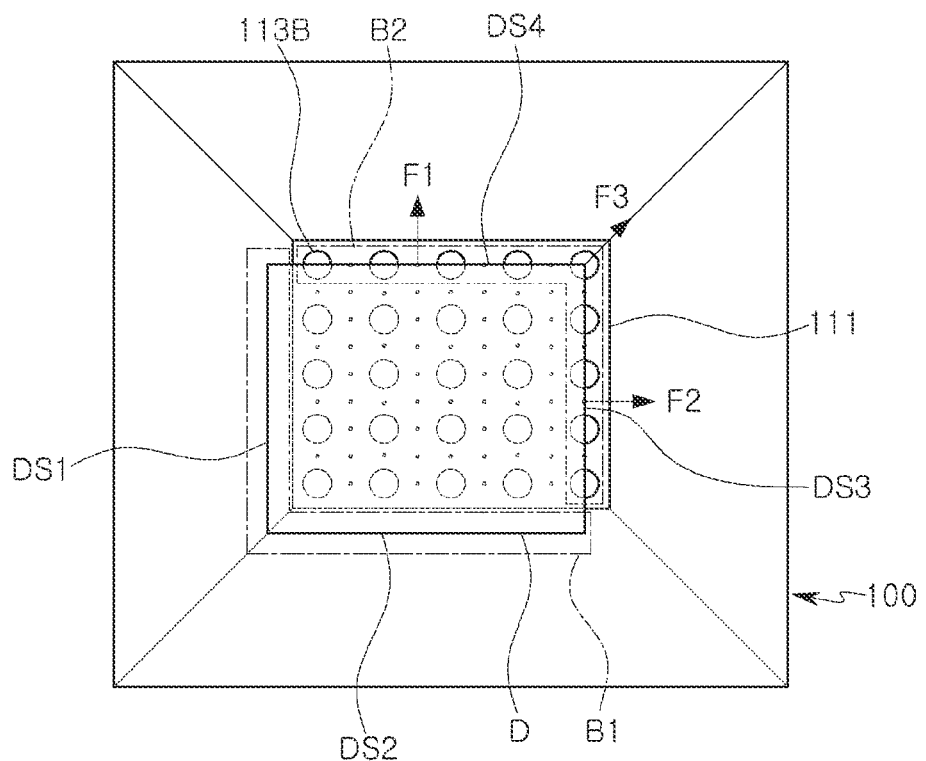
FIG. 5 is a view for reference in describing a process of restoring a substrate held by the substrate transfer device of FIG. 3 to an original position.

FIG. 5 is a view illustrating a process in which the substrate D is automatically aligned by the second vacuum hole 113B if the substrate D is not held at the correct position of the holding region 111.

If the substrate D is not accurately matched to the correct position of the holding region 111 so a partial region B1 of the substrate D protrudes to the outside of the holding region 111, atmospheric pressure is applied to a first side surface DS1 and a second side surface DS2 of the region B1 protruding to the outside of the holding region 111. Meanwhile, the second negative pressure NP2 is applied to a third side surface DS3 and a fourth side surface DS4 of the region B2 overlapping the second vacuum holes 113B. Accordingly, restoring forces F1 and F2 are applied to the third side surface DS3 and the fourth side surface DS4 of the substrate D in a direction to cancel the applied second negative pressure. As a result, the substrate D may move in a direction of a resultant force F3 of the restoring forces F1 and F2 and may be positioned at the correct position in the holding region 111. Accordingly, the substrate D may be automatically aligned at a position exactly matched with the holding region 111.

Referring to FIGS. 3 and 4, the air holes 114 may be distributed and disposed at predetermined intervals in the holding region 111. The air hole 114 may be connected to a compressed air source 130 to inject compressed air supplied from the compressed air source 130 to form positive pressure PP around the air hole 114. The positive pressure PP provided by the air hole 114 may provide a buoyancy force so that the substrate D sucked to the holding region 111 by the negative pressure NP of the vacuum hole 113 does not directly contact the holding region 111. That is, the air hole 114 may provide positive pressure PP acting in a direction opposite to the negative pressure NP of the vacuum hole 113. A width HD3 of the air hole 114 may be smaller than the widths HD1 and HD2 of the vacuum hole 113. In addition, the number of air holes 114 may be larger than the number of vacuum holes 113. The positive pressure PP supplied through the air hole 114 may be adjusted to act on a second distance G2 smaller than the first distance G1 by which the negative pressure NP supplied by the vacuum hole 113 acts. That is, a magnitude of the sum of the negative pressures NP provided by the vacuum holes 113 may be larger than a magnitude of the sum of the positive pressures PP provided by the air holes 114. Therefore, when the body portion 100 approaches the substrate D within the first distance G1, the negative pressure NP may act on the substrate D and the substrate D may be separated from the dicing tape DT and lifted. In addition, when the lifted substrate D approaches the body portion 100 within the second distance G2, the positive pressure PP may act on the substrate D and the substrate D may be held by the body portion 100 in a non-contact manner. In an example embodiment, a magnitude of the positive pressure PP applied from the air hole 114 may be selected within a range of 10 kPA to 100 kPA according to the load DW of the substrate D.

Figure 6:
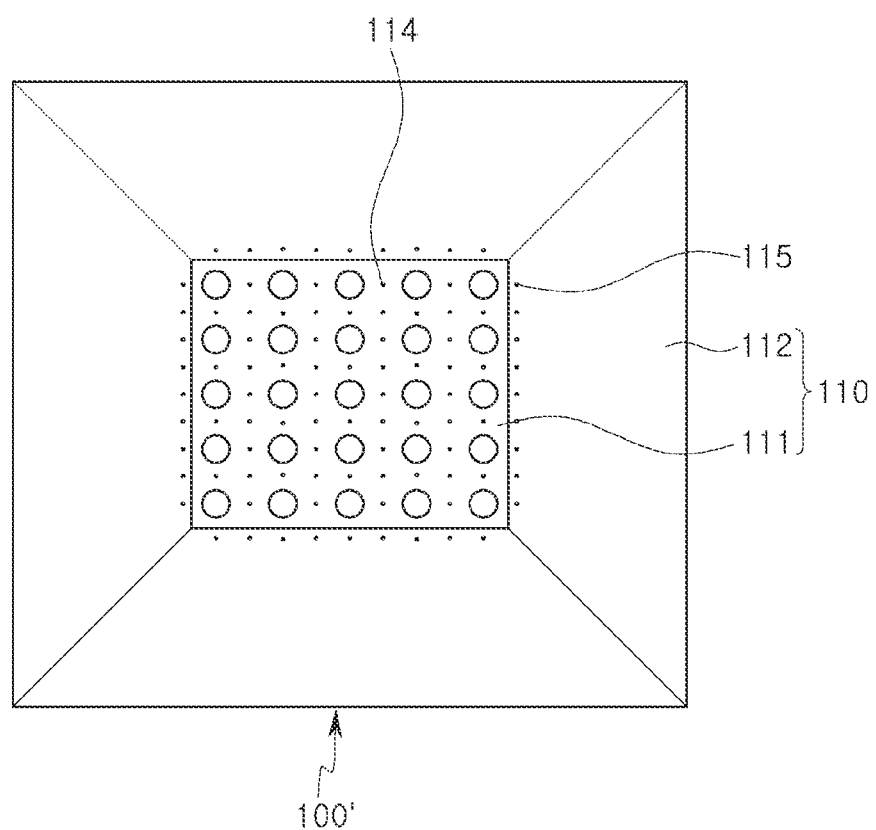
FIGS. 6, 7A, 7B and 7C show a modification of a body portion of the substrate transfer apparatus of FIG. 1.

Referring to FIGS. 3 and 4, the circumferential region 112 may be disposed around the holding region 111 and have a predetermined width. The circumferential region 112 may be disposed around the holding region 111 to prevent the negative pressure NP applied by the vacuum hole 113 and the positive pressure PP applied by the air hole 114 from being unintentionally affected by a surrounding air current. However, the circumferential region 112 may be omitted according to example embodiments. In addition, as shown in FIG. 6, according to an example embodiment, an additional air hole 115 may be further disposed in the circumferential region 112 of a body portion 100' to surround the holding region 111. When the additional air hole 115 is disposed in the circumferential region 112, compressed air discharged from the additional air hole 115 may act as a kind of air curtain. That is, in the process of holding the substrate D, if the substrate D leaves the holding region 111, the substrate D may be pushed back to return to the holding region 111. Accordingly, the substrate D may be held in the holding region 111 more quickly.

In addition, the circumferential region 112 may have a downwardly inclined surface having a predetermined inclination angle θ1 so that the holding region 111 protrudes (see FIG. 2). In addition, the circumferential region 112 may be variously modified as shown in FIGS. 7A through 7C.

Figure 7A:
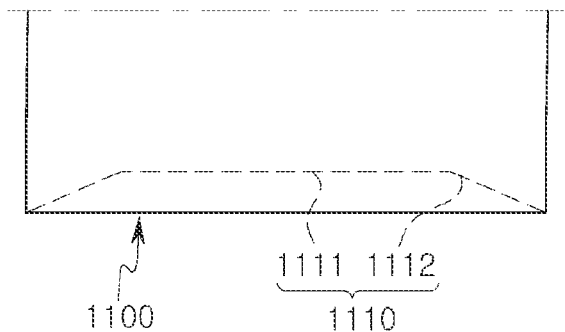

FIG. 7A is a case in which a circumferential region 1112 has an upwardly inclined surface so that a holding region 1111 of a body portion 1100 is disposed in a concave region on the lower surface 1110. In this case, the circumferential region 1112 may act as a barrier wall blocking the substrate to be held from leaving the holding region 1111.

Figure 7B:
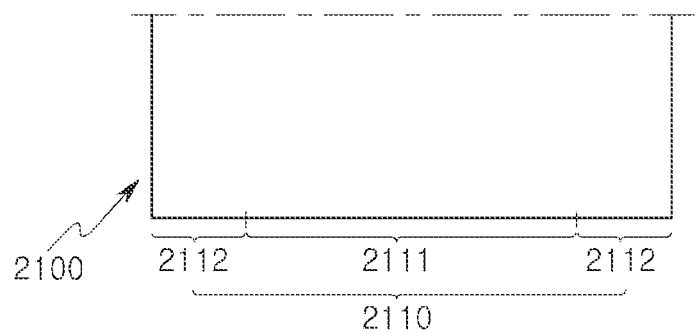

FIG. 7B is a case in which a holding region 2111 of a body portion 2100 is coplanar with a circumferential region 2112. In this case, a lower surface 2110 of the body portion 2100 may form a flat surface.

Figure 7C:
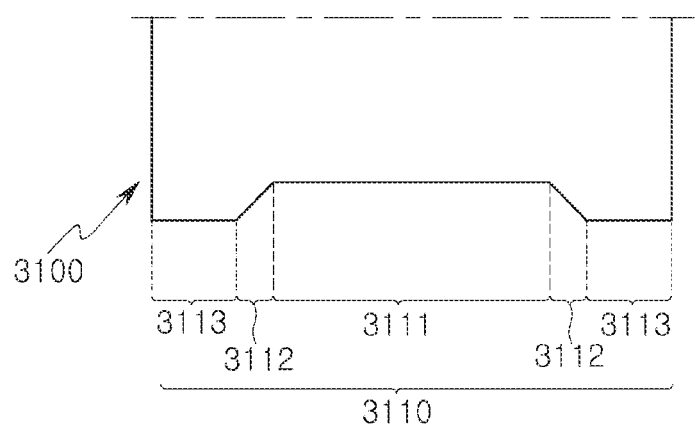

FIG. 7C is a case in which a first circumferential region 3112 and a second circumferential region 3113 are disposed on a lower surface 3110 of a body portion 3100. The first circumferential region 3112 may be disposed to surround a holding region 3111, and the second circumferential region 3113 may be disposed to surround the first circumferential region 3112.

The shape and arrangement of the vacuum holes disposed in the holding region may be variously modified. Various example embodiments of the vacuum hole will be described with reference to FIGS. 8A through 12.

Figure 8A:
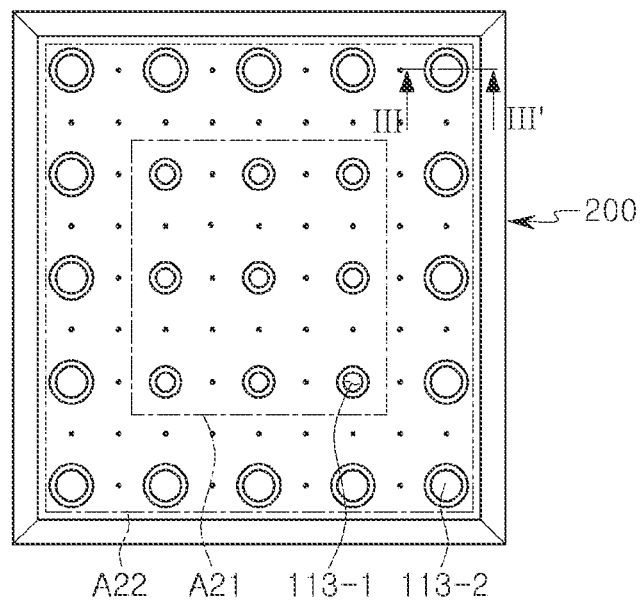
FIGS. 8A, 8B, 9, 10, 11 and 12 are various example embodiments of vacuum holes disposed in a body portion of the substrate transfer apparatus of FIG. 1.
Figure 8B:
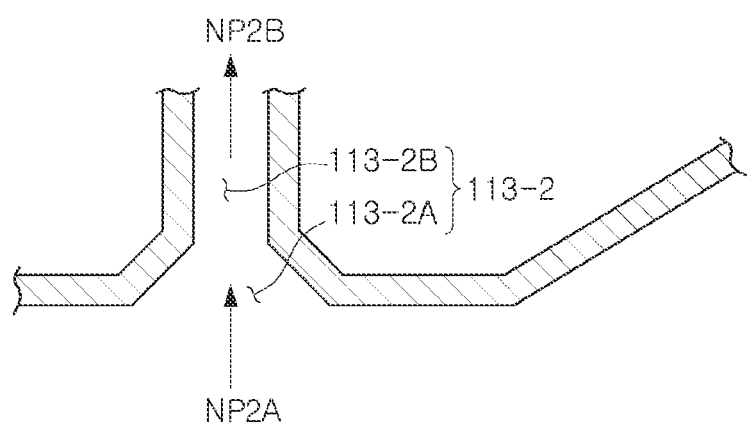

FIG. 8A illustrates an embodiment in which the substrate transfer apparatus 10 has a body portion 200 including a first region A21 that is centrally disposed on a lower surface of the body portion 200 and a second region A22 is disposed so as to circumferentially surround the first region A21 on the lower surface of the body portion 200. FIG. 8B illustrates a view taken along a cross section within FIG. 8A. Referring to FIGS. 8A and 8B, a first vacuum hole 113-1 and a second vacuum hole 113-2 may have a tapered cross-sectional shape. For example, as shown in FIG. 8B, an entrance region 113-2A of the second vacuum hole 113-2 may have a larger cross-sectional area than an internal region 113-2B. As the cross-sectional area of the vacuum hole increases, it may be difficult to uniformly maintain the negative pressure applied to the inside of the vacuum hole at a desired intensity. In an example embodiment, an internal negative pressure NP2B of the internal region 113-2B may be maintained at a desired intensity by forming the internal region 113-2B to be narrower relatively closer to the vacuum source than the entrance region 113-2A.

In addition, since the entrance region 113-2A is formed to have a larger cross-sectional area than the internal region 113-2B, a surface negative pressure NP2A having a magnitude smaller than the internal negative pressure NP2B may reach a wider region.

Figure 9:
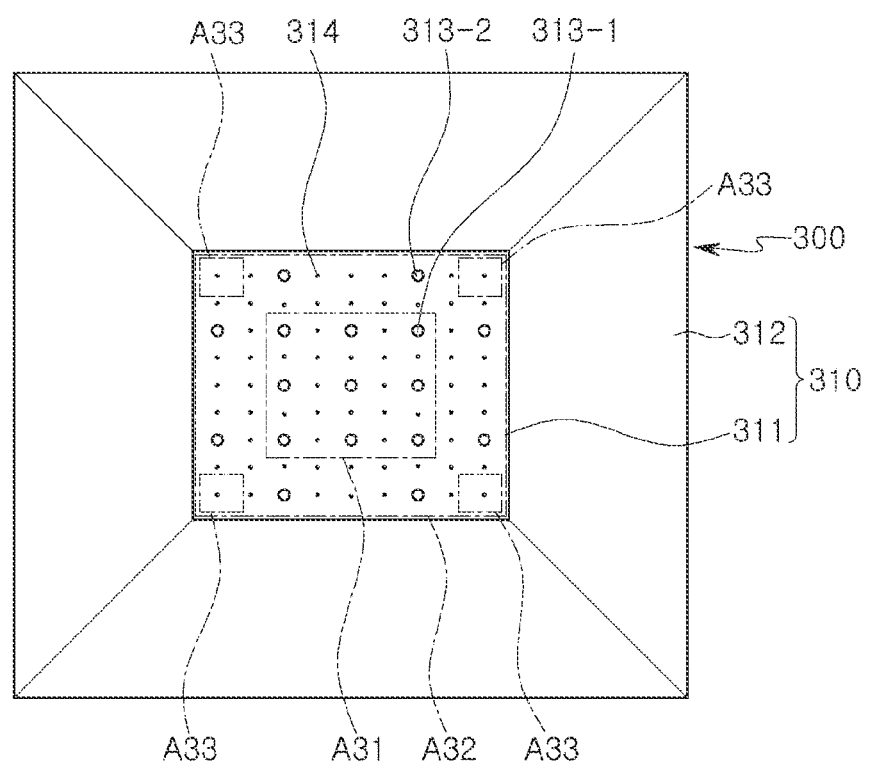

FIG. 9 illustrates an embodiment in which the substrate transfer apparatus 10 has a body portion 300. A lower surface 310 of the body portion 300 includes a holding region 311 and an inclined circumferential region 312. FIG. 9 is a case in which a vacuum hole is not disposed in a vertex region A33 of the holding region 311. An arrangement of a first vacuum hole 313-1 disposed in the first region A31 of the holding region 311 and an arrangement of a second vacuum hole 313-2 disposed in a region of the second region A32 excluding the vertex region A33 are the same as those in the example embodiment described above, and thus, a detailed description thereof will be omitted. Air holes 314 providing the positive pressure PP as a buoyancy force may be distributed throughout the holding region 311.

In the case of an example embodiment, since the second vacuum hole 313-2 is not disposed in the vertex region A33, negative pressure applied to the vertex region of the substrate held in the holding region 311 may be reduced. If the substrate held in the holding region 311 is very thin, in particular, a vertex region of the substrate may be more easily deformed by external pressure. In an example embodiment, since the second vacuum hole 313-2 is not disposed in the vertex region A33 of the holding region 311 so as to correspond to a vertex region of the substrate, the vertex region of the substrate may be prevented from being deformed by the negative pressure of the second vacuum hole 313-2.

Figure 10:
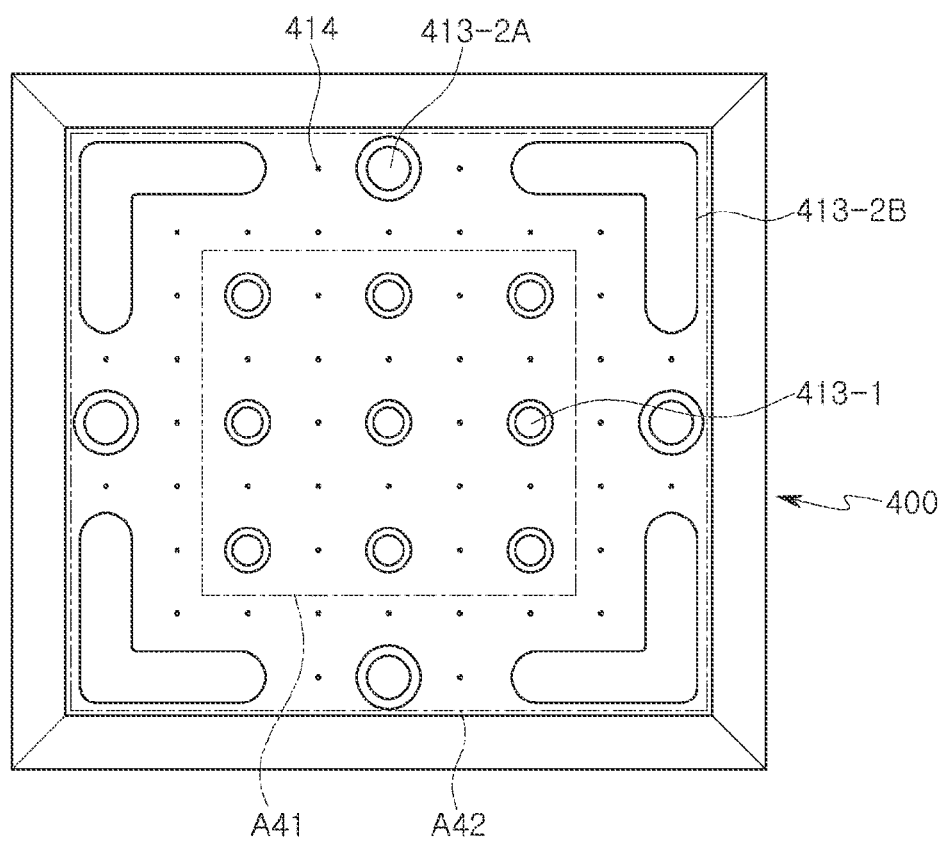

FIG. 10 illustrates an embodiment in which the substrate transfer apparatus 10 has a body portion 400 including a first region A41 that is centrally disposed on a lower surface of the body portion 400 and a second region A42 is disposed so as to circumferentially surround the first region A41 on the lower surface of the body portion 400. FIG. 10 is a case in which a shape of second vacuum holes 413-2A and 413-2B disposed in the second region A42 is modified. First vacuum holes 413-1 are disposed in the first region A41, and air holes 414 providing the positive pressure PP as a buoyancy force may be distributed throughout the first region A41 and the second region A42. Embodiments including of the configuration of FIG. 10 may otherwise be the same as previous embodiments.

In an example embodiment, among the second vacuum holes 413-2A and 413-2B, the second vacuum hole 413-2B disposed in the vertex region of the second region A42 is formed as a long hole. The second vacuum hole 413-2B formed as a long hole increases an area in contact with the edge of the substrate compared to the vacuum hole formed in a circular shape, so that a restoring force applied to the substrate may increase to improve an effect of automatically aligning the substrate.

Figure 11:
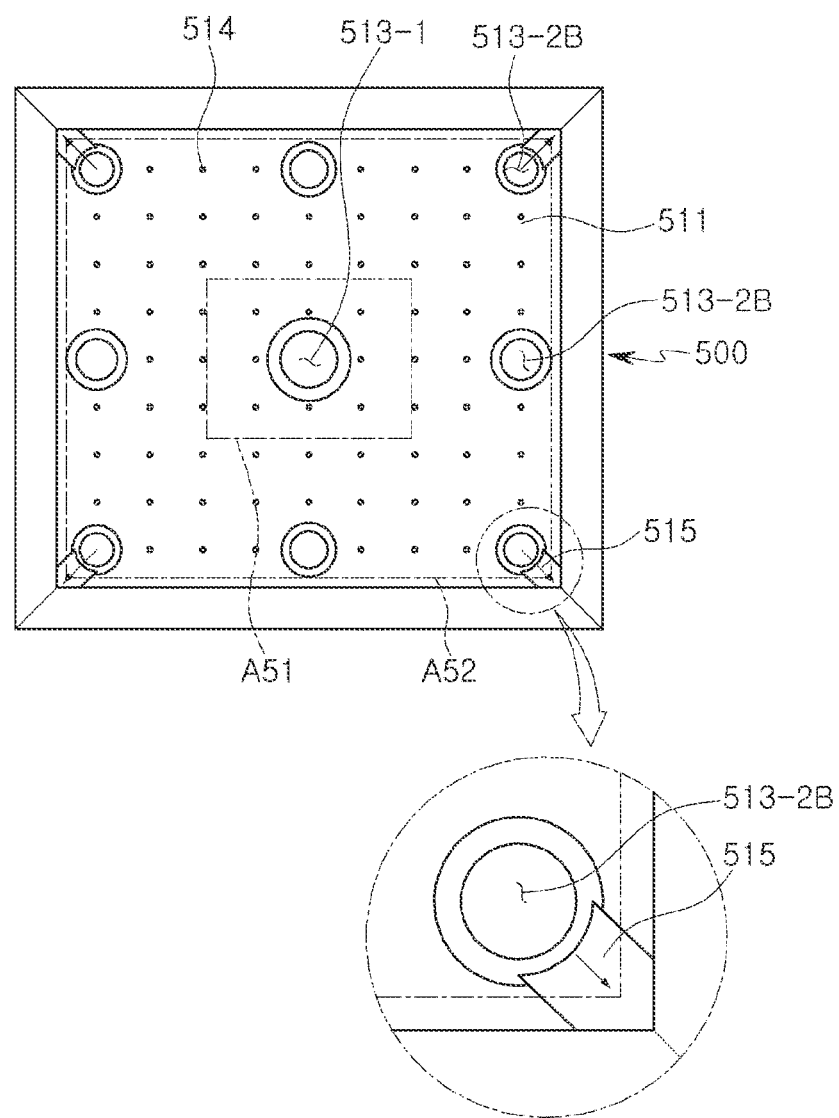

FIG. 11 illustrates an embodiment in which the substrate transfer apparatus 10 has a body portion 500 including a first region A51 that is centrally disposed on a lower surface of the body portion 500 and a second region A52 is disposed so as to circumferentially surround the first region A51 on the lower surface of the body portion 500. FIG. 11 illustrates an example in which a groove 515 stepped in a second vacuum hole 513-2B disposed to be adjacent to the vertex of a second region A52 of the holding region 511 is formed to a depth below a surface of the holding region 511. A first vacuum hole 513-1 is disposed in the first region A51, and air holes 514 providing the positive pressure PP as a buoyancy force may be distributed throughout the first region A51 and the second region A52. Embodiments including of the configuration of FIG. 11 may otherwise be the same as previous embodiments.

The groove 515 formed in the second vacuum hole 513-2B may be formed to face each vertex of the holding region 511. The groove 515 may serve as a passage through which air may flow into the second vacuum hole 513-2B even when the substrate is held above the second vacuum hole 513-2B. Accordingly, negative pressure applied to the vertex region of the substrate held in the holding region 511 may be reduced, compared to a region in which the groove 515 is not formed.

Figure 12:
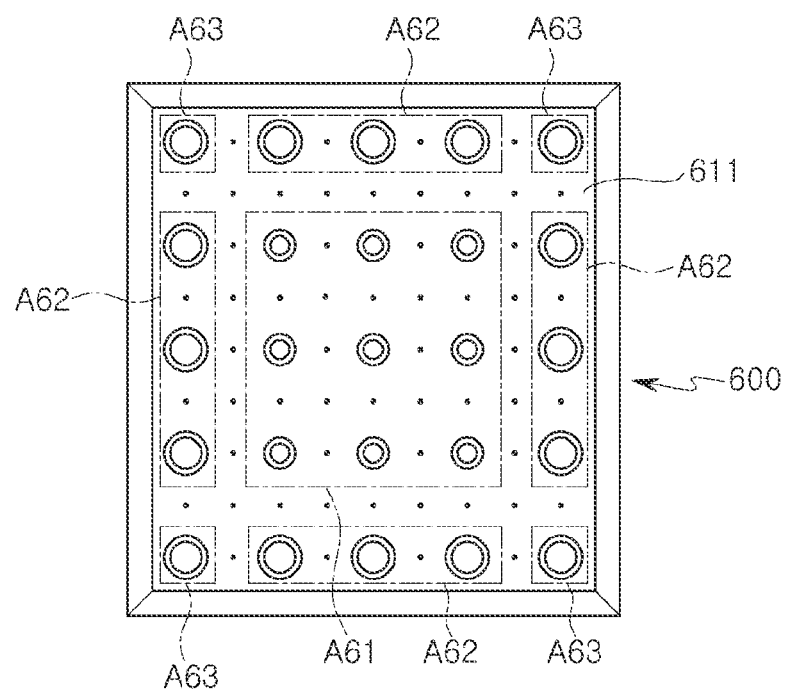

FIG. 12 illustrates an embodiment in which the substrate transfer apparatus 10 has a body portion 600. A lower surface of the body portion 300 includes a holding region 611. FIG. 12 illustrates an example in which the holding region 611 is segmented into three regions, rather than the two regions of the previous embodiments. Embodiments including of the configuration of FIG. 12 may otherwise be the same as previous embodiments. Referring to FIG. 12, the holding region 611 is divided into a first region A61 providing a first negative pressure, a second region A62 providing a second negative pressure, and a third region A63 providing a third negative pressure. The first region A61 may be disposed in the center of the holding region 611. The second region A62 may be disposed at each edge of the holding region 611. The third region A63 may be disposed at each vertex of the holding region 611. A negative pressure having a greatest absolute value may be provided to the first region A61, a negative pressure having a second greatest absolute value may be provided to the second region A62, and a negative pressure having a third greatest absolute value may be provided to the third region A63. Accordingly, negative pressure applied to the edge regions and the vertex regions of the substrate may be reduced relative to that of the center region, so that the effect of holding the substrate in a non-contact manner may be maintained while damage to the substrate is prevented.

The substrate transfer apparatus according to the technical idea of the present disclosure holds and transfers the die in a non-contact manner, and thus, contamination of a surface of the die in contact with the substrate transfer apparatus during a process of transferring the die may be prevented.

While example embodiments have been shown and described above, it will be apparent to those skilled in the art that modifications and variations could be made without departing from the scope of the present disclosure as defined by the appended claims.

What is claimed is:
1. A substrate transfer apparatus comprising:
a body portion having a surface including a rectangular and flat holding region corresponding in shape to a substrate to be transferred, wherein the body portion is movable relative to the substrate such that the surface approaches the substrate up to at least a first distance;

vacuum holes distributed in the holding region and forming negative pressure to provide suction force to the substrate disposed at the first distance, wherein at least some of the vacuum holes are disposed at equal intervals in the holding region and have the same width; and air holes distributed in the holding region and forming positive pressure to provide a buoyancy force to the substrate close to the holding region at a second distance smaller than the first distance.

2. The substrate transfer apparatus of claim 1, wherein:
the holding region includes a first region disposed in a center of the holding region and a second region disposed on a circumference of the first region,
the vacuum holes include a first vacuum hole and a second vacuum hole,
the first vacuum hole and the second vacuum hole are disposed in the first region and the second region, respectively,
the first vacuum hole and the second vacuum hole provide a first negative pressure and a second negative pressure, respectively, and
the first negative pressure has an absolute value that is greater than an absolute value of the second negative pressure.

3. The substrate transfer apparatus of claim 2, wherein the first vacuum hole has a width that is smaller than a width of the second vacuum hole.

4. The substrate transfer apparatus of claim 1, wherein
each of the vacuum holes has a width that is 0.9% to 1.1% of a length of each side of the holding region, and
each of the air holes has a width that is 0.3% to 0.5% of the length of each side of the holding region.

5. The substrate transfer apparatus of claim 1, wherein the surface further includes a circumferential region disposed on a circumference of the holding region.

6. The substrate transfer apparatus of claim 5, wherein the circumferential region has an inclined surface with respect to the holding region.

7. The substrate transfer apparatus of claim 5, wherein the circumferential region has additional air holes forming positive pressure in a region adjacent to the holding region.

8. The substrate transfer apparatus of claim 1, wherein vacuum holes adjacent to each vertex of the holding region, among the vacuum holes, has a stepped groove at a level lower than a level of the holding region toward a vertex of the holding region.

9. The substrate transfer apparatus of claim 1, wherein the substrate has a thickness of 100 μm or less.

10. The substrate transfer apparatus of claim 1, wherein each of the air holes has a width that is smaller than a width of each of the vacuum holes.

11. The substrate transfer apparatus of claim 1, wherein a magnitude of the sum of positive pressures provided by the air holes is smaller than a magnitude of the sum of negative pressures provided by the vacuum holes.

12. A substrate transfer apparatus comprising:
a body portion having a surface including a holding region having a size corresponding to a substrate to be transferred and allowing the substrate to be fixed thereto, wherein the holding region includes a first region disposed in a center of the surface and a second region disposed on a circumference of the first region and disposed to be in contact with each side of the holding region;

vacuum holes distributed in the holding region and providing suction force with respect to the substrate; and
air holes distributed in the holding region, spaced apart from the vacuum holes, and providing a buoyancy force acting in a direction opposite to the suction force by jetting a gas.

13. The substrate transfer apparatus of claim 12, wherein:
the vacuum holes include at least one first vacuum hole and second vacuum holes,
the at least one first vacuum hole is disposed in the first region and the second vacuum holes are disposed in the second region,
the at least one first vacuum hole and the second vacuum holes provide a first negative pressure and a second negative pressure, respectively, and
the first negative pressure has an absolute value greater than an absolute value of the second negative pressure.

14. The substrate transfer apparatus of claim 13, wherein the second vacuum holes are disposed at the same interval in the second region and have the same width.

15. The substrate transfer apparatus of claim 13, wherein the second vacuum holes are disposed to be adjacent to edges of the holding region, respectively.

16. The substrate transfer apparatus of claim 13, wherein a width of the at least one first vacuum hole has the same width as the second vacuum holes.

17. The substrate transfer apparatus of claim 13, wherein a width of the at least one first vacuum hole is smaller than the widths of the second vacuum holes.

18. A substrate transfer apparatus comprising:
a body portion having a surface including a holding region corresponding in shape to a substrate to be transferred, wherein the body portion is movable relative to the substrate such that the holding region approaches the substrate by at least a first distance;
vacuum holes distributed in the holding region and forming negative pressure to provide suction force to the substrate disposed at the first distance, wherein at least some of the vacuum holes are disposed at equal intervals at an edge of the holding region and have a same width; and
air holes distributed in the holding region and forming positive pressure to provide a buoyancy force, with respect to the suction force, to the substrate close to the holding region at a second distance smaller than the first distance.

19. The substrate transfer apparatus of claim 18, wherein:
the vacuum holes include at least one first vacuum hole and second vacuum holes,
the at least one first vacuum hole is disposed in a first region and the second vacuum holes are disposed in a second region,
the at least one first vacuum hole and the second vacuum holes provide a first negative pressure and a second negative pressure, respectively, and
the first negative pressure has an absolute value greater than an absolute value of the second negative pressure.

20. The substrate transfer apparatus of claim 19, wherein the second vacuum holes are disposed at the same interval on a circumference of the holding region and have the same width.

* * * * *